(12) United States Patent
Pattavina

(10) Patent No.: US 6,851,084 B2
(45) Date of Patent: Feb. 1, 2005

(54) FORWARD ERROR CORRECTION METHOD AND SYSTEM FOR RELIABLE TRANSMISSION OF REAL TIME DATA OVER A PACKET BASED NETWORK

(75) Inventor: Jeffrey S. Pattavina, Middletown, CT (US)

(73) Assignee: Harris Corporation, Melbourne, FL (US)

( * ) Notice: Subject to any disclaimer, the term of this patent is extended or adjusted under 35 U.S.C. 154(b) by 0 days.

(21) Appl. No.: 10/310,514

(22) Filed: Dec. 5, 2002

(65) Prior Publication Data

US 2003/0229840 A1 Dec. 11, 2003

Related U.S. Application Data

(60) Provisional application No. 60/387,343, filed on Jun. 10, 2002.

(51) Int. Cl.[7] .............................................. H03M 13/00
(52) U.S. Cl. ...................................... 714/776; 714/747
(58) Field of Search ................................. 714/776, 747

(56) References Cited

U.S. PATENT DOCUMENTS

| | | | |
|---|---|---|---|
| 4,819,236 A | | 4/1989 | Sako et al. |
| 5,870,412 A | * | 2/1999 | Schuster et al. ............. 714/752 |
| 5,943,347 A | * | 8/1999 | Shepard ...................... 714/747 |
| 6,000,053 A | | 12/1999 | Levine et al. |
| 6,141,788 A | * | 10/2000 | Rosenberg et al. .......... 714/776 |
| 6,226,769 B1 | | 5/2001 | Schuster et al. |
| 6,421,387 B1 | * | 7/2002 | Rhee ...................... 375/240.27 |
| 6,421,804 B1 | * | 7/2002 | Lee ............................. 714/755 |
| 6,430,233 B1 | * | 8/2002 | Dillon et al. .................. 725/68 |
| 6,445,717 B1 | * | 9/2002 | Gibson et al. .............. 714/776 |
| 6,490,705 B1 | * | 12/2002 | Boyce ......................... 714/776 |
| 6,505,034 B1 | * | 1/2003 | Wellig ......................... 714/746 |
| 2002/0116715 A1 | * | 8/2002 | Apostolopoulos ...... 375/240.27 |
| 2003/0031198 A1 | * | 2/2003 | Currivan et al. ............. 370/465 |

OTHER PUBLICATIONS

J. Rosenberg, H. Schulzrinne, RFC 2733: An RTP PAyload Format for Generic Forward Error Correction, Dec. 1999, The Internet Society, pp. 1, 5, 6.*
D. Goodman, G. Lockhart, O. Wasem, W. Wong, Waveform substitution techniques for recovering missing speech segments in packet voice communications, Dec. 1986, IEEE Transactions on acoustics, speech, and signal processing, vol. ASSP–3, pp 1440–1441.*
European Telecommunication Standard ETS 300 706, May 1997, Edition 1, p. 21.*

* cited by examiner

Primary Examiner—Guy J. Lamarre
(74) Attorney, Agent, or Firm—McDermott Will & Emery LLP

(57) ABSTRACT

A method of correcting errors in a packet based communications system comprises generating m parity packets from each group of k consecutive data packets to form a code word of k data packets and m parity packets. Each parity packet is a combination of two or more data packets, and each data and parity packet includes a sequence number representative of a relative position of the packet in the code word. The method also includes examining, after transmission, the sequence number associated with each packet to determine if one or more packets from the code word is missing. If any packets are missing, the method includes identifying the one or more missing packets. The method further includes processing the data packets and the parity packets according to the combinations of data packets used to generate the parity packets, so as to recover one or more missing packets.

4 Claims, 8 Drawing Sheets error in *a*, with errors in two other data packets but no errors in parity packets error in *a*, with error in one other data packet and one parity packets error in *a*, with no errors in other data packets but errors in two parity packets = unrecoverable error in *a* and all other data packets; no errors in parity packets error in *a* but no other data packets; errors in three of the parity packets error in *a*, with two errors in other data packets and one error in a parity packet error in *a*, with one error in another data packet and errors in two parity packets = unrecoverable

FORWARD ERROR CORRECTION METHOD AND SYSTEM FOR RELIABLE TRANSMISSION OF REAL TIME DATA OVER A PACKET BASED NETWORK

CROSS-REFERENCE TO RELATED APPLICATIONS

This application is related to the following U.S. applications, of common assignee, from which priority is claimed, and the contents of which are incorporated herein in their entirety by reference: "Forward Error Correction Method And System For Reliable Transmission Of Real Time Data Over A Packet Based Network," U.S. Provisional Patent Application Ser. No. 60/387,343, filed Jun. 10, 2002

STATEMENT REGARDING FEDERALLY SPONSORED RESEARCH

Not Applicable

REFERENCE TO MICROFICHE APPENDIX

Not Applicable

BACKGROUND OF THE INVENTION

The present invention relates to digital communications, and more particularly, to methods and systems for detecting and correcting erasure errors in data transmitted via packet-based networks.

As the speed and performance of the public Internet improve, it becomes an increasingly viable option for transmitting Constant Bit Rate (CBR) data and other selected types of "real-time" data. CBR data includes data such as voice, video, and professional, studio quality (i.e., program) audio. Typically, constant bit rate (CBR) data is formatted into 64 kbps time-slots (TS) and TDM techniques are used to map the time-slots into T1 or E1 frames which are transported over the Public Switched Telephone Network (PSTN). Over time, improvements in Internet Quality of Service (QoS) will transform the public Internet into a low cost, general-purpose multimedia transport medium.

Packet-based distribution of CBR data can thus provide a cost-effective alternative to traditional distribution, which relies on dedicated transmission paths over the Public Switched Telephone Network (PSTN). Such dedicated lines typically incur high recurring monthly costs, or require the use of scarce RF spectrum.

The economic advantage of IP networks derives from the fact that multiple packets streams within the packet network are statistically multiplexed onto shared common circuits. The PSTN, on the other hand, requires streams to have dedicated or nailed up circuits connected end-end.

Although an economic motivation exists for transporting CBR data over packet networks, certain impairment issues inherent in packet networks must be addressed if packet networks are to effectively function as an alternative to transport over traditional dedicated circuits Packet networks were designed primarily to provide a "Best-Effort" service. A Best-Effort service is defined as a service that does not guarantee performance metrics such as end-to-end delay, packet jitter and packet loss, within the packet stream. This is because a packet network works to get packets from point A to point B without regard to the particular path from point A to point B. Specific packets within a data stream may take separate paths to the destination, so that the data stream must be reconstructed once all of the packets arrive at the destination. Due to this best-effort model, the reliability of packet networks to date has been significantly less then what the PSTN network has provided. In general, a packet network exhibits high packet loss rates as well as large packet delay and packet jitter. By comparison, the existing PSTN infrastructure provides an extremely reliability transport system with availability of 99.999%. Error rates the PSTN exhibits are typically on the order of $10^{-9}$, and delay and jitter are tightly controlled. In order to transmit CBR and other Real-Time data via packet networks, communication systems must employ various mechanisms to mitigate the effects of these network impairments.

For non-interactive transmissions, such as radio or television broadcast, latency is of considerably less importance than reception quality, so in the case of a packet loss, the use of Automatic Request for Retransmission (ARQ) or Forward Error-Correction (FEC) is appropriate. For interactive data, however, the delay that a retransmission imposes is not acceptable, and a low-latency FEC provides a more suitable network impairment mechanism.

Although packets can be lost due to transmission errors at the data link level, the primary source of packet losses is congestion in the packet switches and routers. Protocols such as TCP and RTP associate a sequence number with each packet within the packet header. When a packet becomes corrupted, or when a router drops a packet due to congestion, the communications equipment at the destination can determine which packets are missing by observing the sequence numbers. These types of errors (i.e., lost packets) are referred to herein as Packet Erasures. An important difference between packet erasures and traditional bit errors is that with packet erasures, the particular missing packet can be identified because of the sequence numbers. With individual bit errors occurring within a data field, a detection scheme (e.g., CRC) can recognize that one or more bits in a field is in error, but typically can not identify the exact location of the corrupted bit or bits.

Many existing FEC schemes are relatively complex, and they require significant processing resources to accomplish the error correction task. For some FEC schemes, the associated complexity is due not only to the sophisticated arithmetic involved with the error corrections, but also to the fact that that they are designed to correct bit errors within a data field without a priori knowledge of the bit error location. One example of such an FEC scheme is a class of FEC codes known as "Reed-Solomon" codes (referred to as RS codes herein). In general, an RS code can correct h/2 erasures, where h is the number of redundant packets generated and sent along with the data packets.

For other FEC schemes that use a priori knowledge of the bit error location as part of the correction algorithm, the complexity is due solely to the associated arithmetic. One example of such an FEC scheme is a RS code that has been adapted to correct for packet erasures, known as Reed-Solomon Erasure (RSE) codes. In general, an RSE code can correct h erasures, where h is the number of redundant packets generated and sent along with the data packets.

SUMMARY OF THE INVENTION

The foregoing and other objects are achieved by the invention which in one aspect comprises a method of correcting errors in a packet based communications system, wherein a source station transmits data packets to a destination station via network media. As used herein, the term "data packets" may describe data groupings well known in the art typically used for transporting data over packet-based networks via any of several accepted protocols. However, the term "data packets," as used herein, may also generally describe any data blocks, regardless of size, protocol or intended use. For example, the data taken from the DS0 channel of a T1 link may be considered data packets as described herein. As another example, data words taken from a bus in a computer system may also be considered data packets as described herein. The method includes compiling a serial data stream into a sequence of data packets for transmission to the destination station via the network media. The method further includes generating m parity packets from each group of k data packets from the sequence of data packets so as to form a code word of k data packets and m parity packets. In another embodiment, the m parity packets are generated from each group of consecutive data packets from the sequence of data packets. Each of the m parity packets is a combination of two or more of the k data packets, and associating a sequence number with each packet representative of a relative position of the packet in the code word. The method also includes transmitting the m+k packet code word to the destination station via the network media. The method also includes receiving the m+k packet code word at the destination station, and examining the sequence number associated with each packet to determine if one or more packets from the m+k packet code word is missing. If any packets are missing, the method includes identifying the one or more missing packets. The method further includes processing the data packets and the parity packets within the associated code word at the destination station, according to the combinations of data packets used to generate the parity packets, so as to recover one or more missing packets.

In another embodiment, the method further includes generating each of the m parity packets by performing a bit-wise exclusive-or of a pair of data packets.

In another embodiment, the method further includes processing the data packets and the parity packets by analyzing each parity group consisting of a particular parity packet and the particular data packets that were combined to generate that parity packet. The method also includes determining which ones, if any, of the parity group is a missing packet, and combining the remaining packets from the parity group to recover the missing packet.

In another embodiment, the method further includes generating each of the m parity packets by performing a bit-wise exclusive-or of a pair of data packets, wherein each data packet is used to generate two different parity packets.

In another embodiment, the method further includes generating four parity packets from each group of four consecutive data packets.

In another embodiment, the method further includes generating a first parity packet as a bit-wise exclusive-or of a first data packet and a second data packet. The method also includes generating a second parity packet as a bit-wise exclusive-or of a third data packet and a fourth data packet. The method also includes generating a third parity packet as a bit-wise exclusive-or of the first data packet and the third data packet, and a fourth parity packet as a bit-wise exclusive-or of the second data packet and the fourth data packet.

In another embodiment, the method further includes processing the data packets and the parity packets at the destination station in a two-step process. First, correcting a single error, if it exists, in a parity group consisting of the first parity packet, the first data packet and the second data packet. Further, correcting a single error, if it exists, in the parity group consisting of the second parity packet, the third data packet and the fourth data packet. Second, correcting a single error, if it exists, in a parity group consisting of the third parity packet, the first data packet and the third data packet. Further, correcting a single error, if it exists, in the group consisting of the fourth parity packet, the second data packet and the fourth data packet.

In another embodiment, the method further includes determining if errors exist after completing the second step, and if so, repeating the first step and the second step.

In another embodiment, the method further includes replacing unrecoverable missing packets with an immediately preceding packet.

In another embodiment, the method further includes replacing one or more unrecoverable missing packets with a predetermined substitute packet.

In another embodiment, the method further includes replacing one or more unrecoverable missing packets with an average packet calculated by determining an average of a predetermined number of adjacent packets about the missing packet.

In another aspect, the invention comprises a system for correcting errors in a packet based communications system, wherein a source station transmits data packets to a destination station via network media. The system includes a packet assembler and an encoder in the source station, and a decoder in the destination station. The packet assembler compiles a serial data stream into a sequence of data packets for transmission to the destination station via the network media. The encoder receives the data packets from the packet assembler, and generates m parity packets from each group of k consecutive data packets from the sequence of data packets, so as to form a code word of k data packets and m parity packets. Each of the m parity packets is a combination of two or more of the k data packets. The encoder also associates a sequence number with each packet, representative of a relative position of the packet in the code word. The decoder receives the m+k packet code word at the destination station, and examines the sequence number associated with each packet to determine if one or more packets from the m+k packet code word are missing. If any packets are missing, the decoder identifies which one or ones are missing, and processes the data packets and the parity packets within the associated code word according to the combinations of data packets used to generate the parity packets, so as to recover one or more missing packets.

In another embodiment, the encoder generates each of the m parity packets by performing a bit-wise exclusive-or of a pair of data packets.

In another embodiment, the decoder processes the data packets and the parity packets by analyzing each parity group. A parity group consists of a particular parity packet and the particular data packets that were combined to generate that parity packet. The decoder determines which ones, if any, of the parity group is a missing packet, and combines the remaining packets from the parity group to recover the missing packet.

In another embodiment, the encoder generates each of the m parity packets by performing a bit-wise exclusive-or of a pair of data packets. In this embodiment, each data packet is used to generate two different parity packets.

In another embodiment, the encoder generates four parity packets from each group of four consecutive data packets.

In another embodiment, the encoder generates a first parity packet as a bit-wise exclusive-or of a first data packet and a second data packet, and a second parity packet as a bit-wise exclusive-or of a third data packet and a fourth data packet. The encoder also generates a third parity packet as a bit-wise exclusive-or of the first data packet and the third data packet, and a fourth parity packet as a bit-wise exclusive-or of the second data packet and the fourth data packet.

In another embodiment, the decoder processes the data packets and the parity packets at the destination station by correcting a single error, if it exists, in a parity group consisting of the first parity packet, the first data packet and the second data packet. The decoder also corrects a single error, if it exists, in the parity group consisting of the second parity packet, the third data packet and the fourth data packet. The decoder further processes the data by correcting a single error, if it exists, in a parity group consisting of the third parity packet, the first data packet and the third data packet. The decoder also corrects a single error, if it exists, in the parity group consisting of the fourth parity packet, the second data packet and the fourth data packet.

In another embodiment, the decoder determines if errors exist after completing the second step, and if so, repeating the first step and the second step.

In another embodiment, the decoder replaces unrecoverable missing packets with an immediately preceding packet.

In another embodiment, the decoder replaces one or more unrecoverable missing packets with a predetermined substitute packet.

In another embodiment, the decoder replaces one or more unrecoverable missing packets with an average packet calculated by determining an average of a predetermined number of adjacent packets about the missing packet.

BRIEF DESCRIPTION OF DRAWINGS

The foregoing and other objects of this invention, the various features thereof, as well as the invention itself, may be more fully understood from the following description, when read together with the accompanying drawings in which.

DESCRIPTION OF THE PREFERRED EMBODIMENTS

Figure 1:
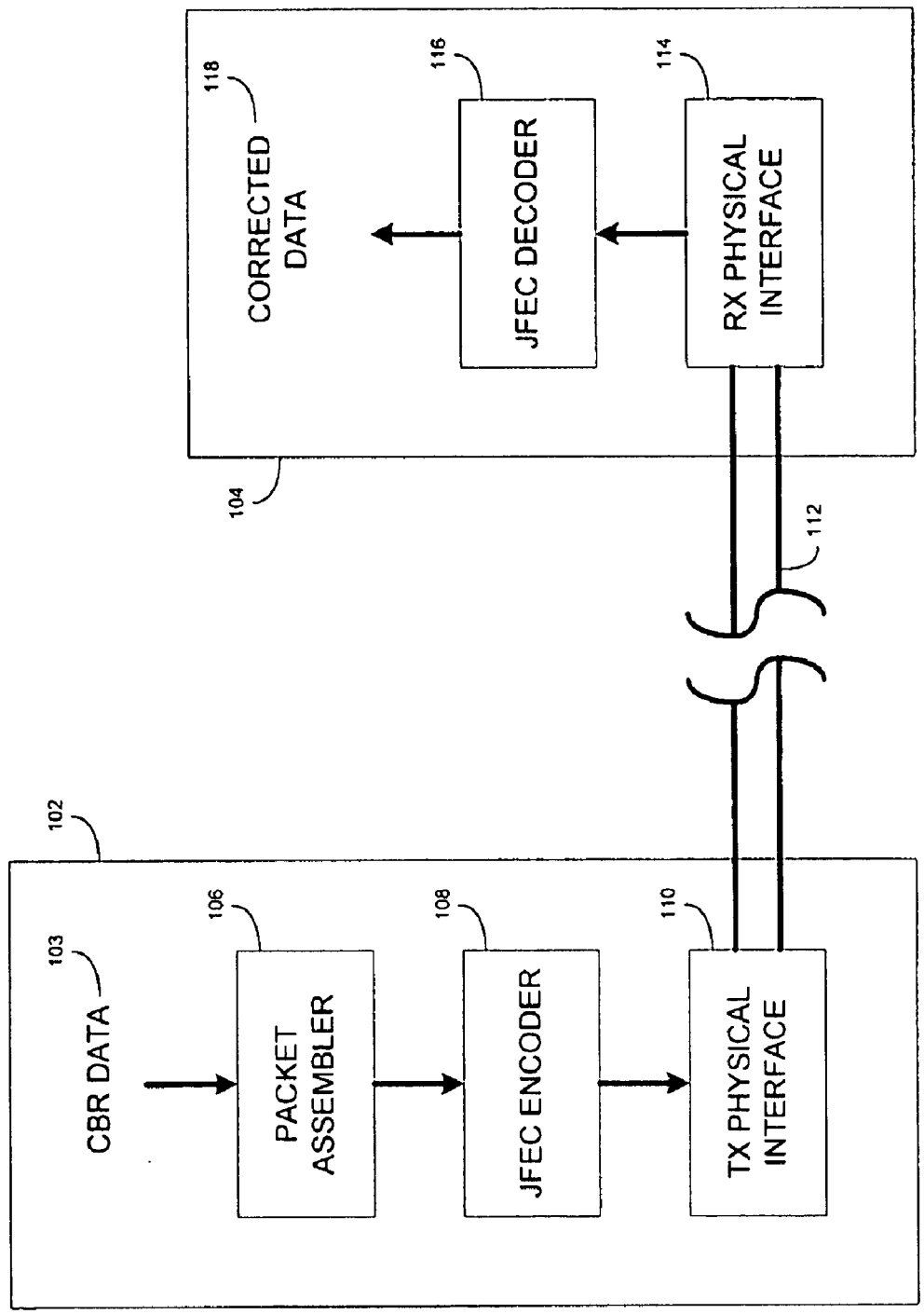
FIG. 1 shows a block diagram view of one preferred embodiment of a forward error correction system.

FIG. 1 shows a block diagram view of one preferred embodiment of a forward error correction system 100 for transmitting real time data from a source station 102 to a destination station 104 over a packet-based network. FIG. 1 shows components necessary for transmission in one direction; additional components are necessary for bi-directional communications. At the source station 102, the correction system 100 includes a packet assembler 106, a forward error correction encoder 108 (referred to herein as a "JFEC" encoder), and a transmitter physical interface component 110. At the destination station 104, the correction system 100 includes a receiver physical interface component 114, and a JFEC decoder 116. The source station 102 and the destination station 104 are connected by the network media 112, which includes any and all of the components of network infrastructure necessary to support the packet network. The infrastructure components may include routers, bridges, switches, and interconnection media (such as cable and optical fiber), among other suitable components.

In the source station, the packet assembler 106 receives the raw CBR (or other real time) data 103 from a data source (e.g., an audio, video or voice CODEC device, a T1 or E1 line, etc.) and forms the data into packets, according to an appropriate packet protocol. In the exemplary embodiments described herein, the data source provides real time data. In general, however, the data 103 from the data source need not be real time data, but can be any sort of data, real time or non-real time, that require error correction following transmission. The packet assembler 106 passes the completed data packets along to the JFEC encoder 108, which generates m parity packets for each set of k data packets it receives from the packet assembler 106. The JFEC encoder 108 thus produces code groups of n packets, wherein each code group includes k data packets plus m parity packets (i.e., n=m+k). In one preferred embodiment, described in more detail herein, the JFEC encoder 108 generates four parity packets for every set of four data packets, so as to form a code group of eight packets. The JFEC encoder 108 passes each code group to the TX physical interface 110, which buffers the packets and drives the packet data onto the packet network media 112 at the physical layer.

At the destination station 104, the RX physical interface 114 receives the packet data at the physical layer, and provides the packet data to the JFEC decoder 116. The JFEC decoder 116 examines the sequence numbers within the packets to determine if any of the packets within a code group are missing. If no packets are missing, the JFEC decoder 116 produces the k data packets as the corrected data 118. If one or more packets are missing, the JFEC decoder 116 processes the code packet group of n packets to recover (in most cases) the k data packets as corrected data 118. For some code groups of packets, the JFEC decoder 116 cannot correct all missing packets. In those cases, the JFEC decoder 116 substitutes a predetermined packet for each of the missing packets. In one embodiment, the JFEC decoder 116 replaces the $N^{th}$ missing packet with the $N-1^{th}$ packet (i.e., the previous received packet). In another embodiment, the JFEC decoder 116 replaces each missing packet with a fixed "substitute" packet, i.e., some predetermined packet. In another embodiment, the JFEC decoder 116 averages the values of a predetermined number packets before and after the missing packet and replaces the missing packet with a packet corresponding to this "average" value, so as to smooth the gap created by the missing packet. The rationale in using this average packet is to minimize the change that occurs across the gap the missing packet forms.

Figure 2:
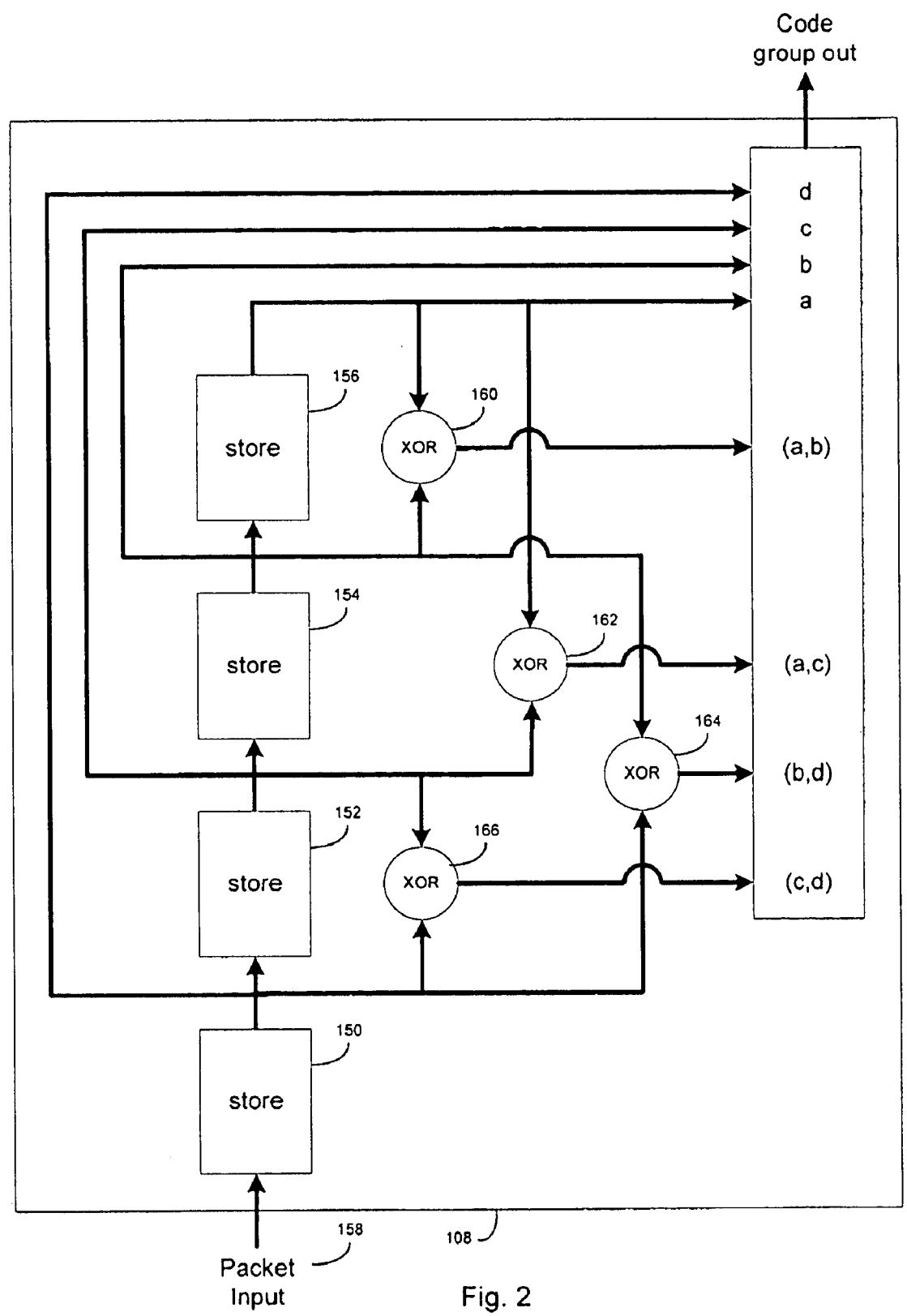
FIG. 2 shows one embodiment of a JFEC encoder from FIG. 1.

FIG. 2 shows one embodiment of a JFEC encoder 108 from FIG. 1, including a first storage element 150, a second storage element 152, a third storage element 154, and a fourth storage element 156, electrically coupled in series, for storing a string of consecutive packets. The embodiment in FIG. 2 is only one way of implementing the encoder concept described herein; in other embodiments, the encoder may be implemented in software running on a processor, in an integrated circuit, or in any other way known in the art for realizing the decoder concept described herein. Further, the embodiment of FIG. 2 describes an exemplary code that generates four parity packets for every four data packets. This particular code is used herein as an example to describe an embodiment. Other embodiments may implement codes with different numbers of data packets and parity packets without departing from the spirit or essential characteristics of the invention. In operation, the string of packets, designated herein by a, b, c and d, are sequentially latched into the string of storage elements 150, 152, 154, and 156 via the packet input port 158. Once latched, packet a is held at the output of the fourth storage element 156, packet b is held at the output of the third storage element 154, packet c is held at the output of the second storage element 152, and packet d is held at the output of the first storage element 150. A first exclusive-OR function 160 (referred to as "XOR gate" for simplicity, although as used herein, an XOR gate does not imply a particular number of inputs or outputs) receives the output b of the third storage element 154 and the output a of the fourth storage element, and produces the logical exclusive-OR of a and b, designated herein as (a, b), i.e., $a \oplus b = (a, b)$. Similarly, a second XOR gate 162 produces (a, c), the logical exclusive-OR of a and c. A third XOR gate 164 produces (b, d), the logical exclusive-OR of b and d, and a fourth XOR gate 166 produces (c, d), the logical exclusive-OR of c and d.

The four data packets of a code group can be visualized as a matrix where packets a and b are stacked on top of packets c and d. A parity packet is then computed for each row (horizontal parity) and each column (verticle parity), as shown in equation (1) below. As used herein, a "parity group" is defined as a parity packet and the data packets used to generate the parity packet. For example, one parity group is given by the data packets a and c, and the parity packet (a, c).

$$\begin{array}{ccc} a & b & \rightarrow (a, b) \\ c & d & \rightarrow (c, d) \\ \downarrow & \downarrow & \\ (a, c) & (b, d) & \end{array} \quad (1)$$

In one embodiment, the code group of packets may be transmitted as follows:

a, b, c, d, (a, b), (c, d), (a, c), (b, d).

In other embodiments, the transmission order of the packets within a code group may be different from that shown above; for example, the parity packets may be transmitted prior to the data packets. Alternatively, the packets may be interleaved upon transmission, or the data packets may be transmitted over a network path different from the path used for the parity packets. In general, the transmission order of the packets is not important, as long as the packets within the code group are gathered together in the JFEC decoder 116 in the destination station 104, and the relative position of the packets within each code group is known.

Figure 3:
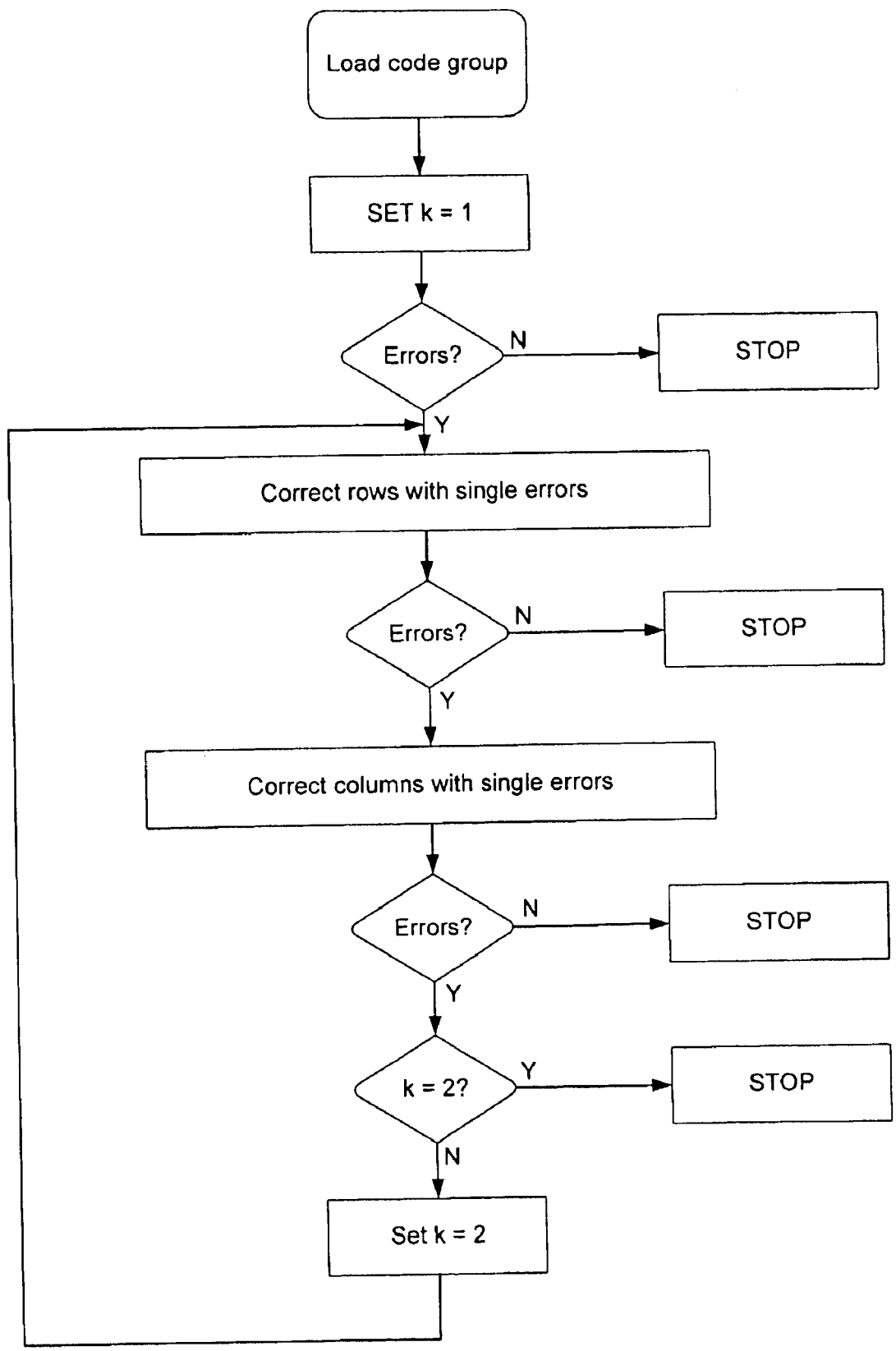
FIG. 3 shows a flow diagram of the steps the JFEC decoder of FIG. 1 performs to decode the packets within the received code group of packets.
Figure 4:
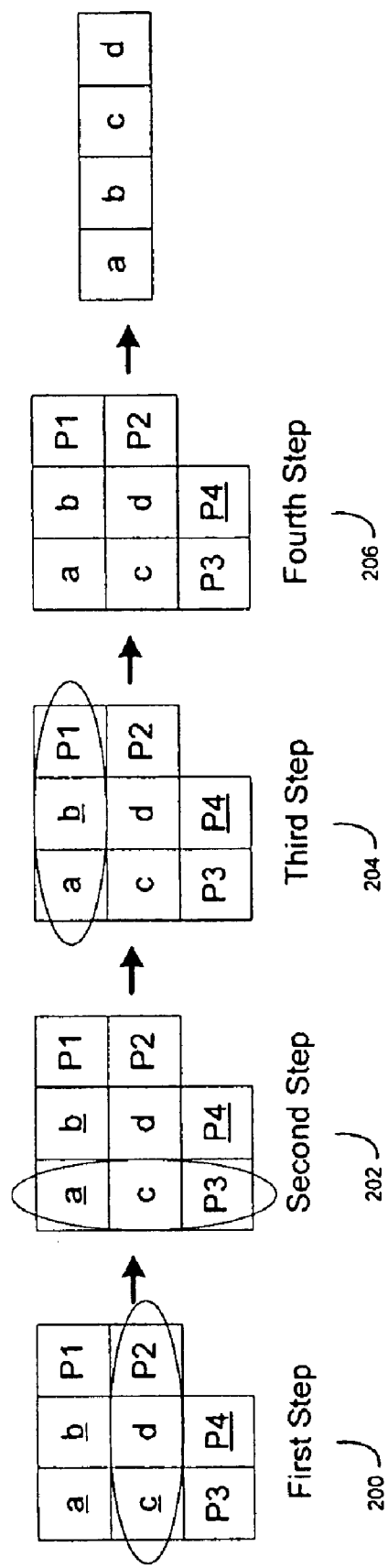
FIG. 4 illustrates how the decoder of FIG. 1 decodes a code group with four packet erasures.

In order to decode the packets within the received code group of packets, the JFEC decoder 116 performs the steps shown in flow diagram of FIG. 3. The JFEC decoder 116 first determines if any errors within the code group exist. An error is defined as a missing packet within the code group. The JFEC decoder 116 determines which packet is missing by examining the sequence numbers within the packets. Once the decoder 116 identifies the missing packets, the decoding algorithm of FIG. 3 makes two passes through the matrix of equation (1). On the first pass, the algorithm examines each row and then each column for single errors, and corrects the errors if detected. In an XOR equation (i.e., $x \oplus y = p$), a missing variable can be calculated by XOR-ing the two known variables (i.e., $x \oplus p = y$, and $y \oplus p = x$). Once all row and column single errors have been corrected, the JFEC decoder 116 makes another pass through the matrix to examine each row and then each column for single errors, and corrects those errors. Note that the first pass through the matrix may reduce some rows and/or columns with double errors to single errors, and then on the second pass the single errors can be eliminated. This concept is shown explicitly via the example in FIG. 4, which illustrates how the decoder 116 decodes a code group with four packet erasures. In this example, P1=(a, b), P2=(c, d), P3=(a, c) and P4=(b, d). The packet erasures (i.e., missing packets a, b, c and P4) are shown as underlined characters. In the first step 200, the decoder 116 examines the rows of the matrix, and calculates the unknown packet c by XOR-ing known packets d and P2. Note that the first row of the matrix cannot be corrected, because two of the packets (a and b) are missing. In the second step 202, the decoder 116 evaluates the matrix columns, and calculates the unknown packet a by XOR-ing packets c and P3. Note that the second column cannot be corrected, because two of the packets (b and P4) are missing. In the third step 204, the decoder 116 takes a second pass at the rows, and this time is able to calculate unknown packet b, since previously-unknown packet a was determined in the second step 202. In the fourth step 206, the decoder 116 takes a second pass at the columns, and this time determines that all four data packets are present, stops the correction procedure and produces the four data packets a, b, c and d as the corrected packet output 118.

Figure 5:
FIG. 5 illustrates, for a four-data packet and four parity packet code group, the possible error patterns given three errors total and an error in one particular data packet.

The Effective Packet Loss (EPL) is a measure of the probability that a particular packet is lost or erased, and cannot be recovered by the code. The following description regarding the EPL for the JFEC code described in (1) derives the error probabilities for the "a." The a packet is representative of the other data packets, so the probabilities for the other packets will be the same. The JFEC code can correct all single and double packet errors. For all possible three-error patterns given an error in a, there will be 2 errors distributed among the remaining 7 packets. This results in the 21 possible error patterns shown in FIG. 5. Packets with errors are shown as underlined characters. Of the 21 error patterns, only one pattern results in packet a being unrecoverable.

Figure 6:
FIG. 6 illustrates, for a four-data packet and four parity packet code group, the possible error patterns given four errors total and an error in one particular data packet.

For all possible 4-error patterns given an error in a, there will be 3 errors distributed among the remaining 7 packets. This results in 35 possible error patterns. Of the 35 patterns only 8 patterns result in packet a not being recovered, as shown in FIG. 6.

The Effective Packet Loss for the JFEC code of (1) may be derived as follows: if $P_{OK}$ is the probability that the packet a was either (i) received without an error or (ii) received with an error but subsequently corrected, then the probability that a has an uncorrectable error is $$EPL = 1 - P_{OK} \quad (2)$$

Let P(a=ok) represent the probability that the packet a was received without an error, and P(a≠ok) represent the probability that the packet a was received with an error (i.e., prior to correction). Then the probability $P_{OK}$ may be given by $$P_{OK} = P(a = ok) + \quad (3)$$
$$P(a \neq ok) \, P(0 \text{ errors among remaining } 7 \text{ pkts}) +$$
$$P(a \neq ok) \, P(1 \text{ errors among remaining } 7 \text{ pkts}) +$$
$$P(a \neq ok) \, P(2 \text{ errors among remaining } 7 \text{ pkts})(20/21) +$$
$$P(a \neq ok) \, P(3 \text{ errors among remaining } 7 \text{ pkts})(27/35)$$

Figure 7:
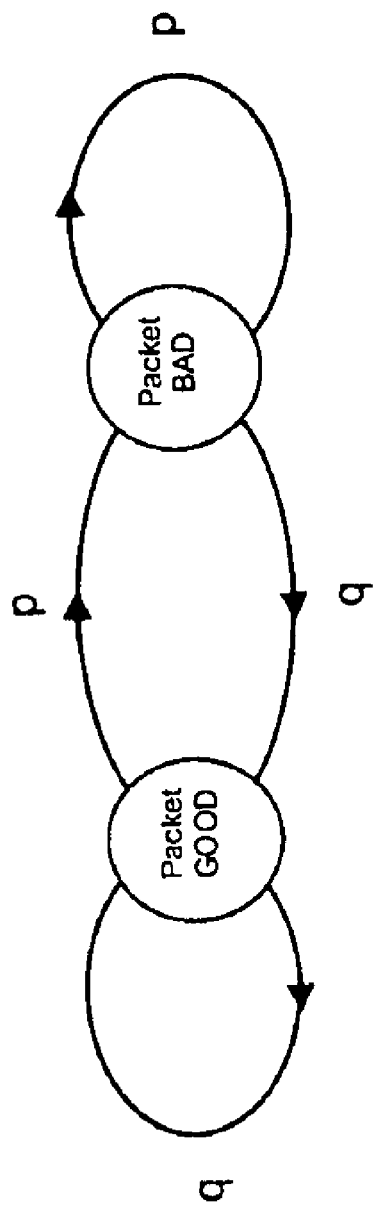
FIG. 7 shows a state diagram of a Bernoulli process.

A Bernoulli process, the state diagram of which is shown in FIG. 7, is used to model the packet losses. A Bernoulli process will yield geometrically distributed packet losses as is generally know to those in the art. The FIG. 7 shows the state diagram for the Bernoulli model. In the figure p is the probability a packet is lost, q is the probability a packet is not lost and p+q=1. Utilizing the Bernoulli model for packet loss we can calculate the Effective Packet Loss (EPL) given by (2), i.e., $$EPL_{JFEC} = 1 - P_{OK} \quad (3)$$
$$= 1 - \left(q + pq^7 + 7p^2q^6 + 21p^3q^5\left(\frac{20}{21}\right) + 35p^4q^4\left(\frac{27}{35}\right)\right)$$
$$= 1 - (q + pq^7 + 7p^2q^6 + 20p^3q^5 + 27p^4q^4)$$

It is useful to compare the JFEC disclosed herein with a RSE previously discussed, which corrects all single, double, triple and quadruple errors. The EPL for this RSE code is:

$$EPL_{RSE} = 1 - (q + pq^7 + 7p^2q^6 + 21p^3q^5 + 35p^4q^4) \quad (4)$$

Figure 8:
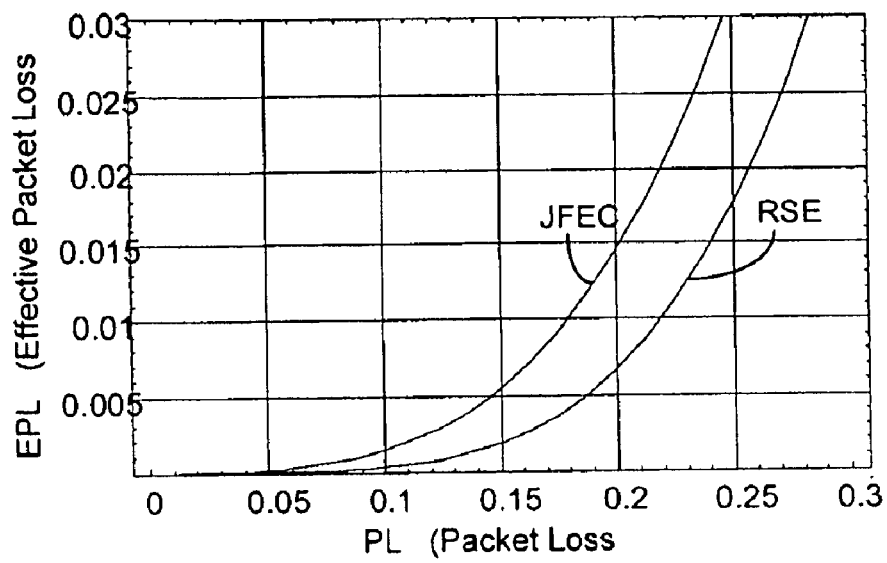
FIG. 8 illustrates graphically the performance between the JFEC and RSE codes described herein; and, FIG. 9 shows experimental results obtained using the JFEC code described herein.

FIG. 8 illustrates graphically the performance between the JFEC and RSE codes described above. The JFEC code may be considered as marginally sub-optimal in the sense that it has a slightly higher EPL than the equivalent RSE code. However, the JFEC has the advantage of being significantly easier to encode and decode while obtaining nearly the same EPL as the RSE. Thus, in many applications it will be desirable to give up a small amount of packet loss to significantly reduce the complexity of the error correction components.

Figure 9:
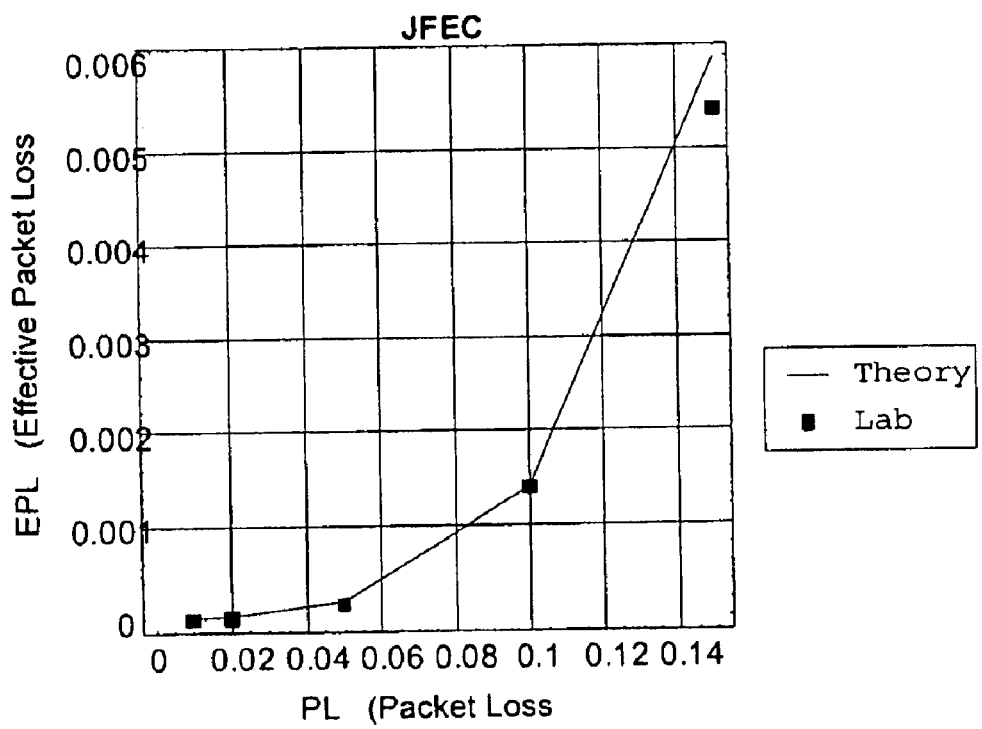

FIG. 9 shows experimental and theoretical results obtained using the JFEC code described herein. Random packet errors were inserted into an audio stream, and subsequently processed with the JFEC code described herein. The number of non-recoverable packet errors, and the total number of packet errors, was then recorded. FIG. 9 plots effective packet loss (EPL) versus actual packet loss (PL). The theoretical values are overlayed with the actual results obtained in the lab.

The invention may be embodied in other specific forms without departing from the spirit or essential characteristics thereof. The present embodiments are therefore to be considered in respects as illustrative and not restrictive, the scope of the invention being indicated by the appended claims rather than by the foregoing description, and all changes which come within the meaning and range of the equivalency of the claims are therefore intended to be embraced therein.

What is claimed is:

1. A method of correcting errors in a packet based communications system, wherein a source station transmits data packets to a destination station via network media, comprising:

compiling a serial data stream into a sequence of data packets for transmission to the destination station via the network media;

generating a first parity packet as a bit-wise exclusive-or of a first data packet and a second data packet from the sequence of data packets;

generating a second parity packet as a bit-wise exclusive-or of a third data packet and a fourth data packet from the sequence of data packets;

generating a third parity packet as a bit-wise exclusive-or of the first data packet and the third data packet from the sequence of data packets; and, generating a fourth parity packet as a bit-wise exclusive-or of the second data packet and the fourth data packet from the sequence of data packets;

forming a code word from the first, second, third, and fourth parity packets, and the first, second, third, and fourth data packets;

associating a sequence number with each packet representative of a relative position of the packet in the code word;

transmitting the eight packet code word to the destination station via the network media;

receiving the eight packet code word at the destination station, and examining the sequence number associated with each packet to determine if one or more packets from the eight packet code word is missing, and identifying the one or more missing packets if any are missing;

processing the data packets and the parity packets within the associated code word at the destination station, according to the combinations of data packets used to generate the parity packets, so as to recover one or more missing packets, wherein processing the data packets includes:

first, correcting a single error, if it exists, in a parity group consisting of the first parity packet, the first data packet and the second data packet, and correcting a single error, if it exists, in a parity group consisting of the second parity packet, the third data packet and the fourth data packet; and second, correcting a single error, if it exists, in a parity group consisting of the third parity packet, the first data packet and the third data packet, and correcting a single error, if it exists, in a parity group consisting of the fourth parity packet, the second data packet and the fourth data packet.

2. A method according to claim 1, wherein processing the data packets further includes determining if errors exist after completing the second step, and if so, repeating the first step and the second step.

3. A system for correcting errors in a packet based communications system, wherein a source station transmits data packets to a destination station via network media, comprising:

a packet assembler in the source station for compiling a serial data stream into a sequence of data packets for transmission to the destination station via the network media;

an encoder in the source station (i) for receiving the data packets from the packet assembler, (ii) for generating a first parity packet as a bit-wise exclusive-or of a first data packet and a second data packet from the sequence of data packets; (iii) for generating a second parity packet as a bit-wise exclusive-or of a third data packet and a fourth data packet from the sequence of data packets; (iii) for generating a third parity packet as a bit-wise exclusive-or of the first data packet and the third data packet from the sequence of data packets; (iv) for generating a fourth parity packet as a bit-wise exclusive-or of the second data packet and the fourth data packet from the sequence of data packets. (v) for forming a code word from the first, second, third, and fourth parity packets, and the first, second, third, and fourth data packets, and (vi) for associating a sequence number with each packet representative of a relative position of the packet in the code word;

a decoder for receiving the eight packet code word at the destination station, and examining the sequence number associated with each packet to determine if one or more packets from the eight packet code word is missing, and identifying the one or more missing packets if any are missing, and for processing the data packets and the parity packets within the associated code word at the destination station, according to the combinations of data packets used to generate the parity packets, so as to recover one or more missing packets, wherein the decoder processes the data packets and the parity packets at the destination station by:

first, correcting a single error, if it exists, in a parity group consisting of the first parity packet, the first data packet and the second data packet, and correcting a single error, if it exists, in a parity group consisting of the second parity packet, the third data packet and the fourth data packet; and second, correcting a single error, if it exists, in a parity group consisting of the third parity packet, the first data packet and the third data packet, and correcting a single error, if it exists, in a parity group consisting of the fourth parity packet, the second data packet and the fourth data packet.

4. A system according to claim 3, wherein the decoder determines if errors exist after completing the second step, and if so, repeating the first step and the second step.

* * * * *